US010068956B2

(12) United States Patent
Park

(10) Patent No.: US 10,068,956 B2
(45) Date of Patent: Sep. 4, 2018

(54) ORGANIC LIGHT EMITTING DISPLAY

(71) Applicant: LG Display Co., Ltd., Seoul (KR)

(72) Inventor: Jinwoo Park, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 456 days.

(21) Appl. No.: 14/802,790

(22) Filed: Jul. 17, 2015

(65) Prior Publication Data

US 2016/0035810 A1 Feb. 4, 2016

(30) Foreign Application Priority Data

Jul. 31, 2014 (KR) .................. 10-2014-0098526

(51) Int. Cl.
 *H01L 27/32* (2006.01)
(52) U.S. Cl.
 CPC ...... *H01L 27/3265* (2013.01); *H01L 27/3276* (2013.01)
(58) Field of Classification Search
 CPC ......... H01L 2251/5315; H01L 27/1446; H01L 27/3227; H01L 27/323; H01L 27/3269; H01L 27/3248; H01L 27/1214; H01L 29/4908; H01L 51/0002; H01L 51/5237
 See application file for complete search history.

(56) References Cited

U.S. PATENT DOCUMENTS

| 2007/0046591 | A1* | 3/2007 | Shishido | ............. | G09G 3/2022 345/77 |
| 2011/0115693 | A1* | 5/2011 | Kim | ...................... | G09G 3/003 345/76 |
| 2012/0175615 | A1* | 7/2012 | You | ..................... | H01L 51/5265 257/57 |
| 2015/0014648 | A1* | 1/2015 | An | ..................... | H01L 27/3265 257/40 |

* cited by examiner

*Primary Examiner* — Eliseo Ramos Feliciano
*Assistant Examiner* — Joannie A Garcia
(74) *Attorney, Agent, or Firm* — Birch, Stewart, Kolasch & Birch, LLP

(57) ABSTRACT

An organic light emitting display can include a substrate, a first capacitor formed on the substrate, the first capacitor including a first capacitor lower electrode, a first capacitor upper electrode, and a gate insulating layer between the first capacitor lower upper electrodes, a first passivation layer over the first capacitor, a second capacitor on the first passivation layer, the second capacitor including a second capacitor lower electrode, a second capacitor upper electrode, and a second passivation layer interposed between the second capacitor lower upper electrodes, an organic insulating layer over the second capacitor, a pixel electrode on the organic insulating layer, an organic layer on the pixel electrode, the organic layer including at least a light emitting layer, and an opposite electrode on the organic layer, and the width of the second capacitor lower electrode is greater than that of the second capacitor upper electrode.

18 Claims, 4 Drawing Sheets

(a)

(b)

ORGANIC LIGHT EMITTING DISPLAY

CROSS-REFERENCE TO RELATED APPLICATIONS

This application claims the benefit of Patent Application No. 10-2014-0098526 filed on Jul. 31, 2014, in the Republic of Korea, which is incorporated herein by reference for all purposes as if fully set forth herein.

BACKGROUND OF THE INVENTION

Field of the Disclosure

This document relates to an organic light emitting display device, and more particularly, to an organic light emitting display device capable of reducing crosstalk by decreasing parasitic capacitance.

Description of the Related Art

Recently, there have been developed various types of flat panel displays capable of reducing the weight and volume of cathode ray tubes, which are disadvantages. Examples of the flat panel displays are liquid crystal displays (LCDs), field emission displays (FEDs), plasma display panels (PDPs), organic light emitting displays (OLEDs), and the like. Among the flat panel displays, an OLED is a self-emissive display emitting light by exciting an organic compound. The OLED can be made lightweight and thin because it does not need a backlight used in an LCD, and can also be made by simple processes. In addition, the OLED has a high response speed of 1 ms or less, low power consumption, a wide viewing angle, high contrast, and the like.

The OLED includes a light emitting layer made of an organic material between a first electrode as an anode and a second electrode as a cathode. Therefore, a hole supplied from the first electrode and an electron supplied from the second electrode combine in the light emitting layer to form an exciton that is an electron-hole pair, causing the OLED to emit light by energy generated upon the exciton being restored to a ground state.

OLEDs are classified into a bottom-emission type and a top-emission type depending on a direction in which light is emitted from the light emitting layer. The bottom-emission type refers to a structure in which light is emitted in a lower electrode of a substrate, i.e., a direction from the light emitting layer to the first direction, and the top-emission type refers to a structure in which light is emitted in an upper direction of the substrate, i.e., a direction from the light emitting layer to the second electrode.

In recent years, as the resolutions of displays gradually become higher, the size of pixels is required to become smaller. One pixel is defined by intersection of gate lines, data lines and common power lines, and includes a switching thin film transistor, a driving thin film transistor, a capacitor and an organic light emitting diode. If the size of the pixel decreases, the thin film transistors and the lines are integrated and thus arranged very close to each other. Therefore, parasitic capacitance is formed between a data line or common power line and a thin film transistor disposed adjacent thereto. Therefore, crosstalk may occur in which the voltage applied to the thin film transistor is changed, thereby resulting in a change in light emitting luminance of the pixel.

SUMMARY OF THE INVENTION

The present invention has been made in an effort to provide an organic light emitting display capable of reducing crosstalk by decreasing parasitic capacitance.

In one aspect, there is an organic light emitting display comprising a substrate, a first capacitor formed on the substrate, the first capacitor including a first capacitor lower electrode, a first capacitor upper electrode, and a gate insulating layer interposed between the first capacitor lower electrode and the first capacitor upper electrode, a first passivation layer formed over the first capacitor, a second capacitor formed on the first passivation layer, the second capacitor including a second capacitor lower electrode, a second capacitor upper electrode, and a second passivation layer interposed between the second capacitor lower electrode and the second capacitor upper electrode, an organic insulating layer formed over the second capacitor, a pixel electrode formed on the organic insulating layer, an organic layer formed on the pixel electrode, the organic layer including at least a light emitting layer, and an opposite electrode formed on the organic layer, wherein the width of the second capacitor lower electrode is greater than that of the second capacitor upper electrode.

In another aspect, there is an organic light emitting display comprising a substrate, a first gate line and a second gate line arranged in one direction on the substrate, a data line formed perpendicular to the first and second gate lines, and a common power line and a reference voltage line formed in parallel to the data line, a switching thin film transistor formed in an intersection region of the first gate line and the data line, a driving thin film transistor formed in an intersection region of the second gate line and the data line, a first capacitor individually connected to the switching thin film transistor and the common power line, the first capacitor including a first capacitor lower electrode and a first capacitor upper electrode forming capacitance with a gate insulating layer interposed therebetween, a second capacitor individually connected to the driving thin film transistor and the reference voltage line, the second capacitor including a second capacitor lower electrode and a second capacitor upper electrode forming capacitance with a first passivation layer interposed therebetween, and an organic layer interposed between a pixel electrode and an opposite electrode connected to the driving thin film transistor, wherein the width of the second capacitor lower electrode is greater than that of the second capacitor upper electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Hereinafter, an organic light emitting display according to an embodiment of the present invention will be described with reference to FIGS. 1 to 3. In the following description, one sub-pixel will be explained as an example to describe the organic light emitting display.

Figure 1:
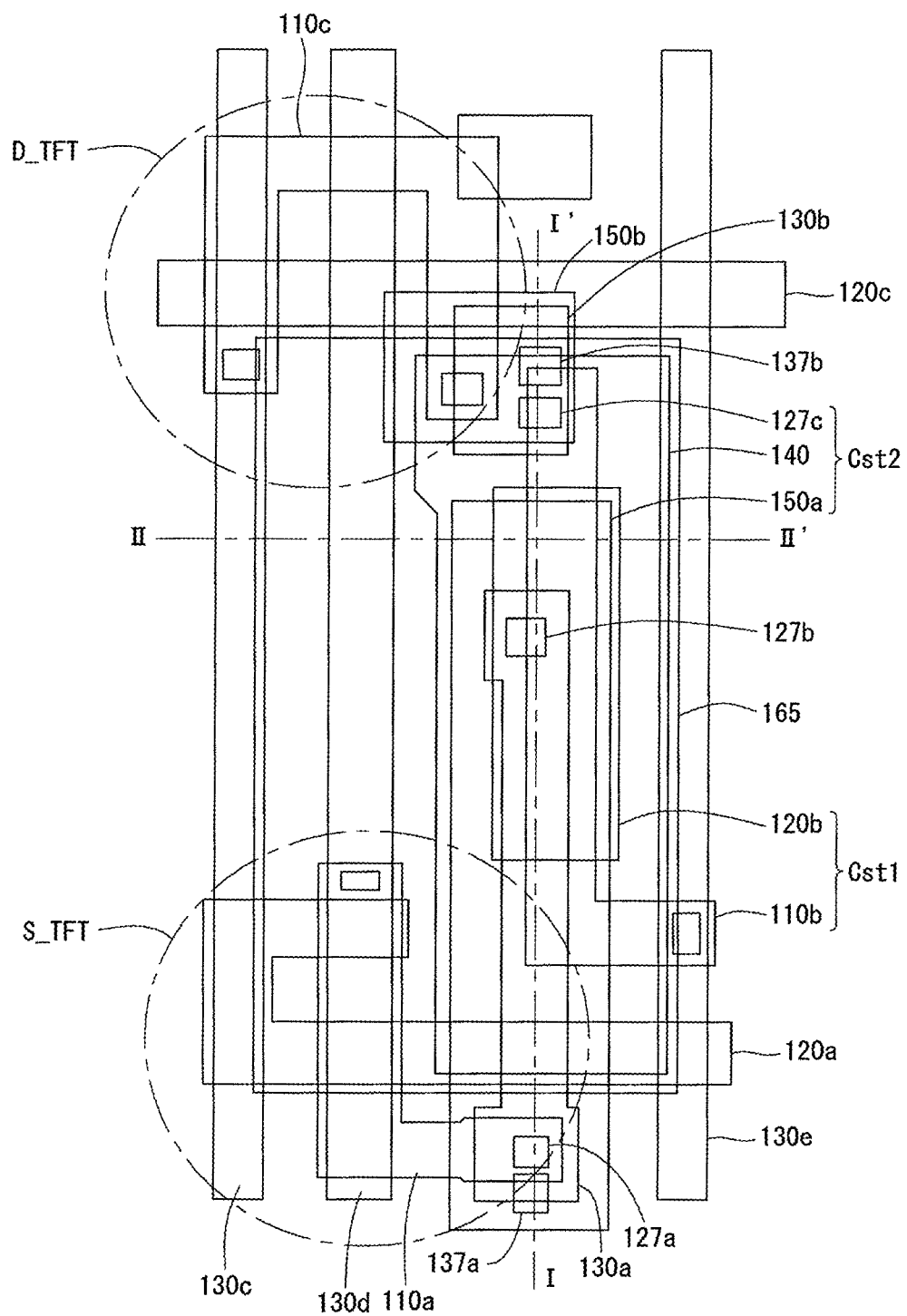
FIG. 1 is a plan view showing a sub-pixel of an organic light emitting display according to an embodiment of the present invention.

FIG. 1 is a plan view showing a sub-pixel of an organic light emitting display according to an embodiment of the present invention. FIG. 2 is a sectional view taken along line I-I' of FIG. 1. FIG. 3 is a sectional view taken along line II-II' of FIG. 1.

Referring to FIG. 1, in the organic light emitting display 100 according to the embodiment of the present invention, a first gate line 120a and a second gate line 120c are laterally arranged in parallel to each other on a substrate 105. A reference voltage line 130c, a data line 130d and a common power line 130e are longitudinally arranged perpendicular to the first gate line 120a and the second gate line 120c. The reference voltage line 130c, the data line 130d and the common power line 130e are arranged in parallel to one another. A sub-pixel is defined by intersection of the first gate line 120a, the second gate line 120c, the reference voltage line 130c, the data line 130d and the common power line 130e.

A first active layer 110a disposed adjacent to the first gate line 120a, a drain electrode 130a and the data line 130d constitutes a switching thin film transistor S_TFT, and a second active layer 110c disposed adjacent to the second gate line 120c and the reference voltage line 130c constitutes a driving thin film transistor D_TFT. A first capacitor lower electrode 110b receiving a voltage applied from the common power line 130e and a first capacitor upper electrode 120b receiving a voltage applied from the switching thin film transistor constitute a first capacitor Cst1 between the switching thin film transistor and the driving thin film transistor. Also, a second capacitor lower electrode 140 receiving a voltage applied from the common power line 130e and a second capacitor upper electrode 150a receiving a voltage applied from the switching thin film transistor constitute a second capacitor Cst2.

Meanwhile, the common power line 130e is connected to a connection pattern 130b through the first capacitor lower electrode 110b, and the connection pattern 130b is connected to a drain electrode 150b of the driving thin film transistor. A pixel electrode 165 is connected to the drain electrode 150b. An organic layer and an opposite electrode are formed on the pixel electrode 165, thereby constituting an organic light emitting diode.

The structure of the sub-pixel of the organic light emitting display shown in FIG. 1 will be described in detail with reference to FIGS. 2 and 3.

Figure 2:
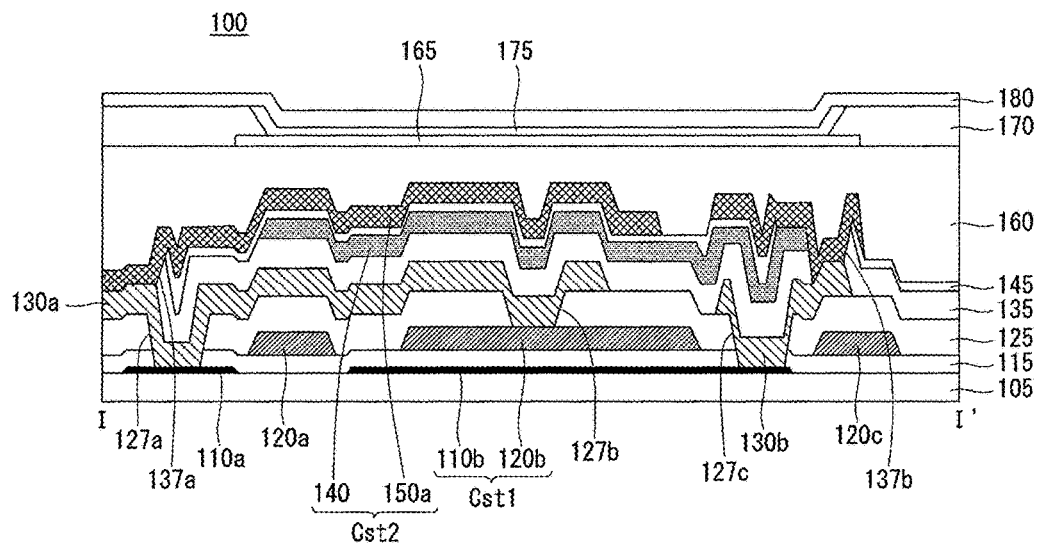
FIG. 2 is a sectional view taken along line I-I' of FIG. 1.

Referring to FIG. 2, in the organic light emitting display 100 according to the embodiment of the present invention, the first active layer 110a, the first capacitor lower electrode 110b and the second active layer are formed on the substrate 105. The first active layer 110a, the first capacitor lower electrode 110b and the second active layer may be made of a material conducted by injecting impurity ions into amorphous silicon (a-Si). A buffer layer made of silicon oxide or silicon nitride may be further formed between the substrate 105 and the first active layer 110a, the first capacitor lower electrode 110b and the second active layer.

A gate insulating layer 115 insulating the first active layer 110a, the first capacitor lower electrode 110b and the second active layer from each other is formed over the first active layer 110a, the first capacitor lower electrode 110b and the second active layer. The gate insulating layer 115 may be formed of silicon nitride (SiNx), silicon oxide (SiOx) or multiple layers thereof. The first gate line 120a, the first capacitor upper electrode 120b and the second gate line 120c are formed on the gate insulating layer 115. The first gate line 120a, the first capacitor upper electrode 120b and the second gate line 120c are formed of a single layer made of any one selected from the group consisting of aluminum (Al), molybdenum (Mo), titanium (Ti), gold (Au), silver (Ag), tungsten (W) and alloy thereof, or multiple layers thereof.

An interlayer insulating layer 125 insulating the first gate line 120a, the first capacitor upper electrode 120b and the second gate line 120c from each other is formed over the first gate line 120a, the first capacitor upper electrode 120b and the second gate line 120c. The interlayer insulating layer 125 may be formed of silicon nitride (SiNx), silicon oxide (SiOx) or multiple layers thereof. The drain electrode 130a and the connection pattern 130b of the switching thin film transistor are formed on the interlayer insulating layer 125. The connection pattern 130b connects the first capacitor lower electrode 110b and the drain electrode 150b of the driving thin film transistor. The drain electrode 130 and the connection pattern 130b are made of a low-resistance material to reduce line resistance, and may be formed of a single layer made of any one selected from the group consisting of molybdenum (Mo), titanium (Ti), aluminum (Al), gold (Au), silver (Ag), tungsten (W) and alloy thereof, or multiple layers thereof. The drain electrode 130a is connected to the first active layer 110a through a first contact hole 127a formed in the gate insulating layer 115 and the interlayer insulating layer 125, the drain electrode 130a is connected to the first capacitor upper electrode 120b through a second contact hole 127b formed in the interlayer insulating layer 125, and the connection pattern 130b is connected to the first capacitor lower electrode 110b through a third contact hole 127c formed in the gate insulating layer 115 and the interlayer insulating layer 125. Thus, the first capacitor lower electrode 110b and the first capacitor upper electrode 120b form the first capacitor Cst1 with the gate insulating layer 115 interposed therebetween.

Meanwhile, a first passivation layer 135 is formed over the drain electrode 130a and the connection pattern 130b. The first passivation layer 135 may be formed of silicon nitride (SiNx), silicon oxide (SiOx) or multiple layers thereof. The second capacitor lower electrode 140 is formed on the first passivation layer 135. The second capacitor lower electrode 140 is formed in a region corresponding to the first capacitor Cst1 described above. The second capacitor lower electrode 140 is made of a material having conductivity to form capacitance, and may be formed of a single layer made of any one selected from the group consisting of molybdenum (Mo), titanium (Ti), aluminum (Al), gold (Au), silver (Ag), tungsten (W) and alloy thereof, or multiple layers thereof.

A second passivation layer 145 is formed over the second capacitor lower electrode 140. The second passivation layer 145 may be formed of silicon nitride (SiNx), silicon oxide (SiOx) or multiple layers thereof. The second capacitor upper electrode 150a and the drain electrode 150b of the driving thin film transistor are formed on the second passivation layer 145. The second capacitor upper electrode 150a is formed to correspond to the second capacitor lower electrode 140 described above. The second capacitor upper electrode 150a and the drain electrode 150b of the driving thin film transistor are made of a material having conductivity to form capacitance, and may be formed of a single layer made of any one selected from the group consisting of molybdenum (Mo), titanium (Ti), aluminum (Al), gold (Au), silver (Ag), tungsten (W) and alloy thereof, or multiple layers thereof.

The second capacitor upper electrode 150a is connected to the drain electrode 130a of the switching thin film transistor through a third contact hole 137a formed in the first passivation layer 135 and the second passivation layer 145. Also, the second capacitor lower electrode 140 is connected to the connection pattern 130b through a fourth contact hole 137b formed in the first passivation layer 135 and the second passivation layer 145. Thus, the second capacitor upper electrode 150a and the second capacitor lower electrode 140 form the second capacitor Cst2 with the second passivation layer 145 interposed therebetween.

Meanwhile, an organic insulating layer 160 is formed over the first and second capacitors Cst1 and Cst2 formed on the substrate 105. The organic insulating layer 150 is a planarization layer planarizing unevenness formed therebeneath, and may be made of an organic material including benzocyclobutene (BCB)-based resin, acrylate-based resin such as photo acryl, polyimide resin, etc. The pixel electrode 165 is formed on the organic insulating layer 160. The pixel electrode 165 is a transparent electrode, and may be made of a transparent material having a high work function, such as indium tin oxide (ITO), indium zinc oxide (IZO), indium cerium oxide (ICO) or zinc oxide (ZnO). When the pixel electrode 165 is a reflective electrode, the pixel electrode 165 may include a reflective layer at a lower portion thereof. The pixel electrode 165 may be formed in a lamination structure of, for example, APC/ITO or ITO/APC/ITO.

A bank layer 170 is formed on the organic insulating layer 160 including the pixel electrode 165. The bank layer 170 exposes a portion of the pixel electrode 165, thereby defining a light emitting region, and may be made of an organic material including polyimide resin, benzocyclobutene-based resin, acrylate-based resin, etc. An opening exposing the pixel electrode 165 is formed in the bank layer 170. An organic layer 175 is formed on the bank layer 170 and the pixel electrode 165. The organic layer 175 includes at least a light emitting layer, and may further include at least one of a hole injection layer, a hole transport layer, an electron transport layer and an electron injection layer. An opposite electrode 180 is formed on the substrate 105 including the organic layer 175. The opposite electrode 180 is a transparent electrode through which light emitted from the light emitting layer passes, and may be made of magnesium (Mg), silver (Ag), calcium (Ca), aluminum (Al) or alloy thereof, which has a low work function. Thus, the pixel electrode 165, the organic layer 175 and the opposite electrode 180 constitute an organic light emitting diode.

Meanwhile, the relationship between the capacitors and the common power line in the organic light emitting display of embodiments of the present invention will be described in detail with reference to FIG. 3. In the following description, explanations of components identical to those of FIG. 2 will be omitted.

Figure 3:
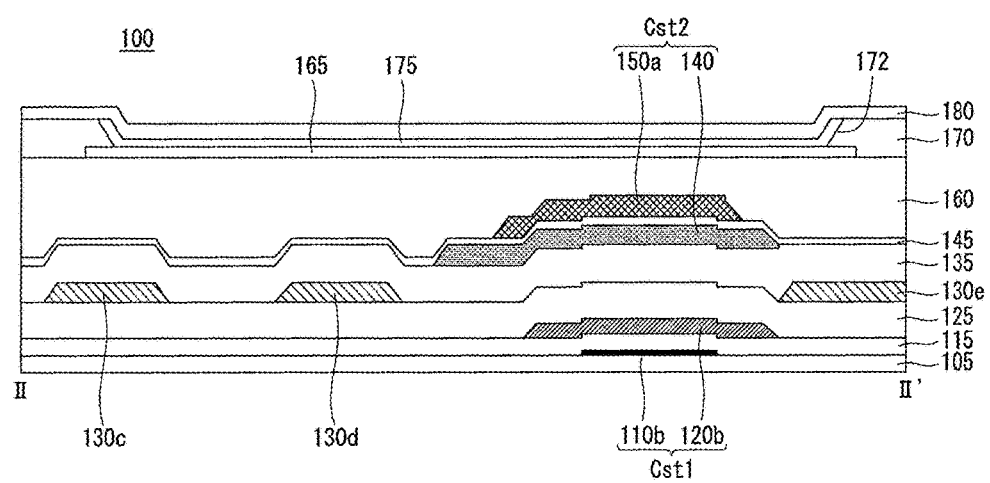
FIG. 3 is a sectional view taken along line II-II' of FIG. 1.

Referring to FIG. 3, in the organic light emitting display 100 according to the embodiment of the present invention, the first capacitor lower electrode 110b and the gate insulating layer 115 insulating the first capacitor lower electrode 110b are formed on the substrate 105. The first capacitor upper electrode 120b is formed on the gate insulating layer 115. Thus, the first capacitor lower electrode 110b and the first capacitor upper electrode 120b constitute the first capacitor Cst1. The interlayer insulating layer 125 is formed over the first capacitor upper electrode 120b, and the reference voltage line 130c, the data line 130d and the common power line 130e are formed on the interlayer insulating layer 125. The reference voltage line 130c and the data line 130d are formed adjacent to each other at one side of the first capacitor Cst1, and the common power line 130e is formed at the other side of the first capacitor Cst1.

The first passivation layer 135 is formed over the reference voltage line 130c, the data line 130d and the common power line 130e. The second capacitor upper electrode 140 is formed on the first passivation layer 135, and the second passivation layer 145 is formed over the second capacitor lower electrode 140. Also, the second capacitor upper electrode 150a is formed on the second passivation layer 145. Thus, the second capacitor lower electrode 140 and the second capacitor upper electrode 150a constitute the second capacitor Cst2 with the second passivation layer 145 interposed therebetween. The second capacitor Cst2 is formed at a position corresponding to the first capacitor Cst1. For example, the second capacitor Cst2 can be disposed over the first capacitor Cst1 and the second capacitor Cst2 can fully cover the first capacitor Cst1.

Meanwhile, as the resolutions of organic light emitting displays become higher, the size of sub-pixels becomes smaller. Hence, the capacitance of the capacitor formed in the existing sub-pixel is also decreased. Accordingly, in the organic light emitting display 100 according to embodiments of the present invention, the existing first capacitor Cst1 is formed, and a separate second capacitor Cst2 is further formed above the first capacitor Cst1. The second capacitor Cst2 compensates for the capacitance decreased as the size of the capacitor Cst1 is reduced. Thus, the second capacitor Cst1 is formed at a position corresponding to the first capacitor Cst1, to minimize the area added due to the occupation of the second capacitor Cst2.

If the size of the sub-pixel is reduced, the second capacitor Cst2 is formed very close to the data line 130d, and therefore, a parasitic capacitor may be formed between the second capacitor Cst2 and the data line 130d. Accordingly, in the embodiment of the present invention, the width of the second capacitor lower electrode 140 adjacent to the data line 130d is formed greater than that of the second capacitor upper electrode 150a, thereby decreasing the capacitance of a parasitic capacitor formed between the second capacitor upper electrode 150a and the data line 130d.

Figure 4:
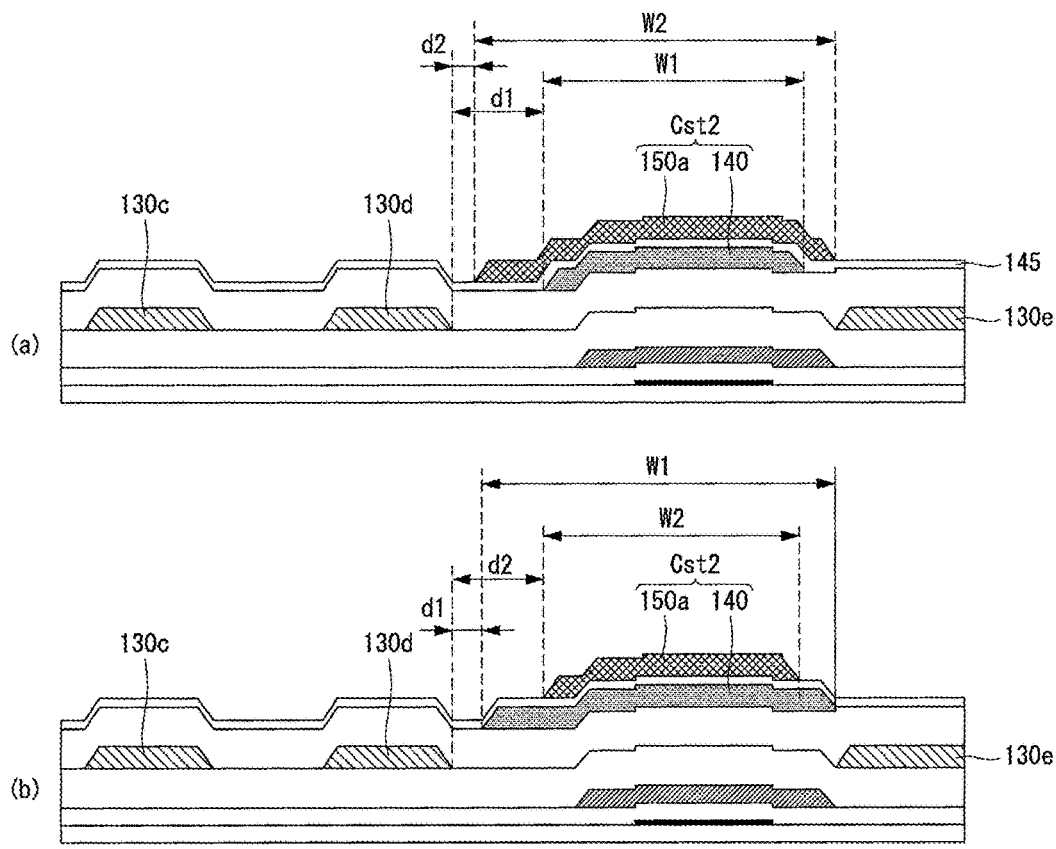
FIG. 4 is a sectional view showing a second capacitor of an organic light emitting display according to an embodiment of the present invention.
Figure 5:
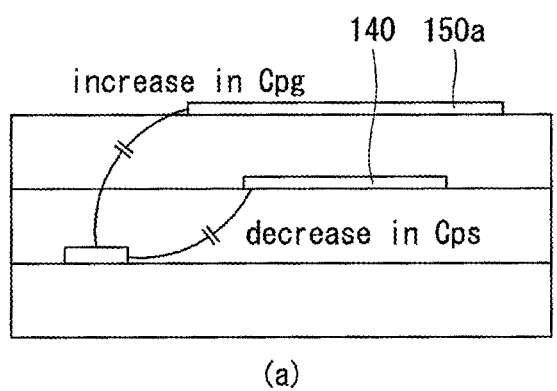
FIG. 5 is a schematic view showing a capacitance formed between the second capacitor and a data line.
Figure 5:
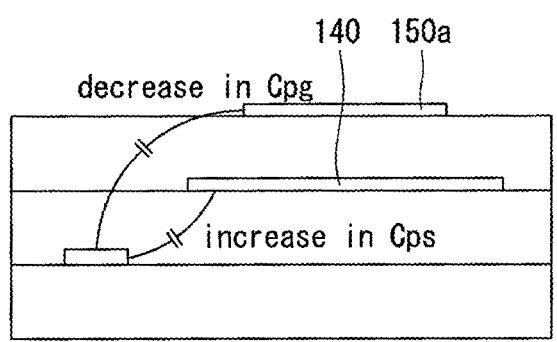

More specifically, a structure in which the widths of the second capacitor electrodes are changed will be described as follows. FIG. 4 is a sectional view showing a second capacitor of an organic light emitting display according to an embodiment of the present invention. FIG. 5 is a schematic view showing a capacitance formed between the second capacitor and a data line.

Referring to FIG. 4, in the embodiment, a second capacitor Cst2 is formed adjacent to a data line 130d. In the second capacitor Cst2, a second capacitor lower electrode 140 and a second capacitor upper electrode 150a form capacitance with a second passivation layer 145 interposed therebetween. Referring to (a) of FIG. 4, if the width W2 of the second capacitor upper electrode 150a of the second capacitor Cst2 is formed greater than that W1 of the second capacitor lower electrode 140 of the second capacitor Cst2, the second capacitor upper electrode 150a is disposed relatively adjacent to the data line 130d. Accordingly, a parasitic capacitor is formed between the second capacitor upper electrode 150a and the data line 130d. Therefore, the voltage/current of a driving thin film transistor is changed depending on a signal of the data line 130d, thereby generating crosstalk. Particularly, in a high-resolution model, the region within a sub-pixel is narrow, and hence there is a limitation in increasing the distance between the second capacitor upper electrode 150a and the data line 130d.

Therefore, the parasitic capacitor is formed between the second capacitor upper electrode 150a and the data line 130d.

In an embodiment of the present invention, as shown in (b) of FIG. 4, the width W1 of the second capacitor lower electrode 140 is formed greater than that W2 of the second capacitor upper electrode 150a, thereby decreasing the capacitance of the parasitic capacitor formed between the second capacitor upper electrode 150a and the data line 130d. In other words, the distance d1 on a plane between the second capacitor lower electrode 140 and the data line 130d is formed shorter than that d2 on a plane between the second capacitor upper electrode 150a and the data line 130d.

Referring to FIG. 5, the second capacitor lower electrode 140 is contacted with a source or drain electrode, and the second capacitor upper electrode 150a is contacted with a gate electrode. Therefore, if the second capacitor lower electrode 140 is adjacent to the data line 130d, the capacitance of a parasitic capacitor Cps between the second capacitor lower electrode 140 and the data line 130d is increased. However, the crosstalk is more effectively influenced by a parasitic capacitor Cpg between the second capacitor upper electrode 150a and the data line 130d, and hence the capacitance of the parasitic capacitor Cpg between the second capacitor upper electrode 150a and the data line 130d is reduced, thereby suppressing the crosstalk.

Accordingly, in embodiments of the present invention, the width W1 of the second capacitor lower electrode 140 is formed greater than that W2 of the second capacitor upper electrode 150a, or the distance d1 on the plane between the second capacitor lower electrode 140 and the data line 130d is formed shorter than that d2 on the plane between the second capacitor upper electrode 150a and the data line 130d, so that a fringe component between the second capacitor upper electrode 150a and the data line 130d can be shielded, thereby reducing the crosstalk.

Particularly, in embodiments of the present invention, although the width W1 of the second capacitor lower electrode 140 is formed greater than that W2 of the second capacitor upper electrode 150a, the width W2 of the second capacitor upper electrode 150a is decreased instead of increasing the width W1 of the second capacitor lower electrode 140, so that the capacitance of the second capacitor Cst2 can be substantially maintained as it is.

Table 1 is a table obtained by measuring capacitances and current deviations per frame between the second capacitor upper electrode and data line according to a comparative example and an embodiment. In the following description, the comparative example has the structure of (a) of FIG. 4, in which the second capacitor upper electrode is further adjacent to the data line than the second capacitor lower electrode. The embodiment has the structure of (b) of FIG. 4, in which the second capacitor lower electrode is further adjacent to the data line than the second capacitor upper electrode.

TABLE 1

|  | Comparative Example | Embodiment |
| --- | --- | --- |
| Cpg (capacitance between second capacitor upper electrode and data line) | 3.46 | 0.87 |
| Current deviation per frame (%) | 2.93 | 0.82 |

Referring to Table 1, in the organic light emitting display according to the embodiment of the present invention, the capacitance of the parasitic capacitor Cpg between the second capacitor upper electrode and the data line was 0.87, which was decreased by about 75% as compared with 3.46 of the comparative example. Also, in the organic light emitting display according to the embodiment of the present invention, the current deviation per frame, causing crosstalk, was 0.82%, which was remarkably reduced as compared with 2.93% of the comparative example.

As described above, in the organic light emitting display according to the embodiment of the present invention, the width of the second capacitor lower electrode is formed greater than that of the second capacitor upper electrode, so that the capacitance of the parasitic capacitor between the second capacitor upper electrode and the data line can be decreased, thereby reducing the crosstalk.

Further, in the organic light emitting display according to the embodiment of the present invention, the second capacitor is additionally formed together with the first capacitor, so that the size of the sub-pixel can be reduced as the resolution of the organic light emitting display becomes high. Thus, although the capacitance of the first capacitor is decreased, the capacitance of the second capacitor can be maintained.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display, comprising:
a substrate;
a first capacitor formed on the substrate, the first capacitor including a first capacitor lower electrode, a first capacitor upper electrode, and a gate insulating layer interposed between the first capacitor lower electrode and the first capacitor upper electrode;
a first passivation layer formed over the first capacitor;
a second capacitor formed on the first passivation layer, the second capacitor including a second capacitor lower electrode, a second capacitor upper electrode, and a second passivation layer interposed between the second capacitor lower electrode and the second capacitor upper electrode;
an organic insulating layer formed over the second capacitor;
a pixel electrode formed on the organic insulating layer;
an organic layer formed on the pixel electrode, the organic layer including at least a light emitting layer; and
an opposite electrode formed on the organic layer,
wherein a width of the second capacitor lower electrode is greater than a width of the second capacitor upper electrode,
wherein the second capacitor lower electrode is closer to a data line than the second capacitor upper electrode, and
wherein the second capacitor lower electrode is configured to reduce crosstalk in the organic light emitting display by shielding the second capacitor upper electrode from the data line.

2. The organic light emitting display of claim 1, wherein a first distance on a plane between the second capacitor lower electrode and the data line is shorter than a second distance on a plane between the second capacitor upper electrode and the data line.

3. The organic light emitting display of claim 1, wherein the first capacitor and the second capacitor overlap each other.

4. The organic light emitting display of claim 1, further comprising a drain electrode of a switching thin film transistor and a connection pattern.

5. The organic light emitting display of claim 4, wherein the drain electrode is connected to the first capacitor upper electrode and the connection pattern is connected to the first capacitor lower electrode.

6. The organic light emitting display of claim 4, wherein the second capacitor upper electrode is connected to the drain electrode of the switching thin film transistor.

7. The organic light emitting display of claim 6, wherein the second capacitor lower electrode is connected to the connection pattern.

8. The organic light emitting display of claim 1, wherein the pixel electrode overlaps both the first capacitor and the second capacitor.

9. An organic light emitting display, comprising:
a substrate;
a first gate line and a second gate line arranged in one direction on the substrate, a data line formed perpendicular to the first and second gate lines, and a common power line and a reference voltage line formed in parallel to the data line;
a switching thin film transistor formed in an intersection region of the first gate line and the data line;
a driving thin film transistor formed in an intersection region of the second gate line and the data line;
a first capacitor individually connected to the switching thin film transistor and the common power line, the first capacitor including a first capacitor lower electrode and a first capacitor upper electrode forming capacitance with a gate insulating layer interposed therebetween;
a second capacitor individually connected to the driving thin film transistor and the reference voltage line, the second capacitor including a second capacitor lower electrode and a second capacitor upper electrode forming capacitance with a first passivation layer interposed therebetween; and
an organic layer interposed between a pixel electrode and an opposite electrode connected to the driving thin film transistor,
wherein a width of the second capacitor lower electrode is greater than a width of the second capacitor upper electrode.

10. The organic light emitting display of claim 9, wherein the second capacitor lower electrode is closer to the data line than the second capacitor upper electrode.

11. The organic light emitting display of claim 9, wherein a first distance on a plane between the second capacitor lower electrode and the data line is shorter than a second distance on a plane between the second capacitor upper electrode and the data line.

12. The organic light emitting display of claim 9, wherein the first capacitor and the second capacitor overlap each other.

13. The organic light emitting display of claim 9, further comprising a drain electrode of a switching thin film transistor and a connection pattern.

14. The organic light emitting display of claim 13, wherein the drain electrode is connected to the first capacitor upper electrode and the connection pattern is connected to the first capacitor lower electrode.

15. The organic light emitting display of claim 13, wherein the second capacitor upper electrode is connected to the drain electrode of the switching thin film transistor.

16. The organic light emitting display of claim 15, wherein the second capacitor lower electrode is connected to the connection pattern.

17. The organic light emitting display of claim 9, wherein the second capacitor lower electrode is configured to reduce crosstalk in the organic light emitting display by shielding the second capacitor upper electrode from the data line.

18. The organic light emitting display of claim 9, wherein the second capacitor lower electrode is electrically connected to the first capacitor lower electrode and the second capacitor upper electrode is electrically connected to the first capacitor upper electrode such that the first capacitor and the second capacitor are configured to provide a combined total capacitance for the organic light emitting display.

* * * * *